United States Patent [19]

Gabuzda

[11] Patent Number: 4,682,651
[45] Date of Patent: Jul. 28, 1987

[54] SEGMENTED HEAT SINK DEVICE

[75] Inventor: Paul G. Gabuzda, Laguna Beach, Calif.

[73] Assignee: Burroughs Corporation (now Unisys Corporation), Detroit, Mich.

[21] Appl. No.: 904,442

[22] Filed: Sep. 8, 1986

[51] Int. Cl.⁴ .............................................. F28F 7/00
[52] U.S. Cl. .................................. 165/80.3; 165/185; 174/16 HS; 357/81
[58] Field of Search ............................. 165/80.3, 185; 174/16 HS; 361/380, 381, 382, 383, 384, 385, 386; 357/81

[56] References Cited

U.S. PATENT DOCUMENTS

| | | | |
|---|---|---|---|
| 3,149,666 | 9/1964 | Coe | 165/80.3 X |
| 3,180,404 | 4/1965 | Nelson et al. | 165/185 |
| 3,217,793 | 11/1965 | Coe | 165/185 X |
| 3,220,471 | 11/1965 | Coe | 165/80.3 X |
| 3,312,277 | 4/1967 | Chitouras et al. | 165/185 |
| 3,342,255 | 9/1967 | Risk et al. | 174/16 HS |
| 3,766,977 | 10/1973 | Pranda et al. | 165/185 X |
| 4,103,192 | 7/1978 | Wendt et al. | 165/185 X |
| 4,398,208 | 8/1983 | Murano et al. | 357/81 |
| 4,541,004 | 9/1985 | Moore | 357/81 |

FOREIGN PATENT DOCUMENTS 3326478 2/1985 Fed. Rep. of Germany ...... 361/386
54921 4/1951 France ............................... 165/185

OTHER PUBLICATIONS

"Integral Edge Connector", IBM Technical Disclosure Bulletin, vol. 20, No. 11A, Apr. 1978, pp. 4346-4348.
"New Products for Design", Electronic Design, Jun. 6, 1964, p. 102.

Primary Examiner—Albert W. Davis, Jr.
Assistant Examiner—Randolph A. Smith
Attorney, Agent, or Firm—Alfred W. Kozak; Nathan Cass

[57] ABSTRACT

A segmented heat sink device is provided for application to integrated circuit packages for heat dissipation purposes. The segmented heat sink device involves four duplicate sectors, each of which has a patterned set of radial fin elements through which cooling air flow may run. The reduction of the base length of each segment provides for reduction in expansion/contraction stress due to the heating and cooling cycles involved.

11 Claims, 2 Drawing Figures

४,६८२,६५१

SEGMENTED HEAT SINK DEVICE

FIELD OF THE INVENTION

This disclosure relates to specialized heat sinks used for the cooling of integrated circuit package components.

CROSS REFERENCES TO RELATED APPLICATIONS

This application is related to a copending application entitled "Reduced-Stress Heat Sink Device" by inventor Paul G. Gabuzda filed in the U.S. Patent Office on July 18, 1986, as U.S. Ser. No. 886,994 pending.

BACKGROUND OF THE INVENTION

In modern day digital equipment, there has been developing a greater and greater density of packaging on printed circuit boards, and a higher density of printed circuit boards in computer and digital cabinetry. In this situation, there have been numerous ways developed to reduce the generation of internal heat and to carry away the excessive heat build-up.

One of the basic ways of doing this has been to develop metallic fins and other heat conducting means by which cooling air can be used to carry away the accumulated internal heat within the integrated circuit packages that are used on the printed circuit boards.

A major problem has been to provide for the maximization of the heat reduction and at the same time, to be economically feasible, while, additionally providing for ease of application to areas which are restricted in space and cooling capacity.

Thus, in order to minimize the problems of economic feasibility, the problems of providing for heat dissipation in small compact areas, and to provide easy adaptability to high density integrated circuit packages while using a minimum of labor activity, there has been developed a segmented heat sink device for attachment to the top of an integrated circuit package which provides four sectors, independent of each other, with radial metallic fins which are configured to form a central orifice area whereby cooling air can operate into the orifice area and outwardly pass by the fins to provide the required cooling action.

In these types of situations for handling the cooling in high density areas, one major problem has been the loosening of the adhesive bond between the integrated circuit package and the heat sink device. By segmenting the heat sink device into four independent and separate sectors, the effective length involved in the cycle of heat expansion and cooling contraction is considerably reduced, thus to minimize any degradation of the adhesive effect between the heat sink device and the integrated circuit package.

SUMMARY OF THE INVENTION

The present invention provides an intercooperative heat sink device which is basically composed of four duplicative sectors placed in juxtaposition by adhesion to an integrated circuit package. However, each sector is separated in space, by a small gap from the other sectors so as to provide a discontinuity between each sector, thus acting to lessen the overall length of the entire heat sink device, and thus to minimize the expansion-contraction effect which would tend to degrade or even to break the adhesive contact between the top of the integrated circuit board and the bottom of the sectors of the heat sink device.

DESCRIPTION OF A PREFERRED EMBODIMENT

Figure 1:
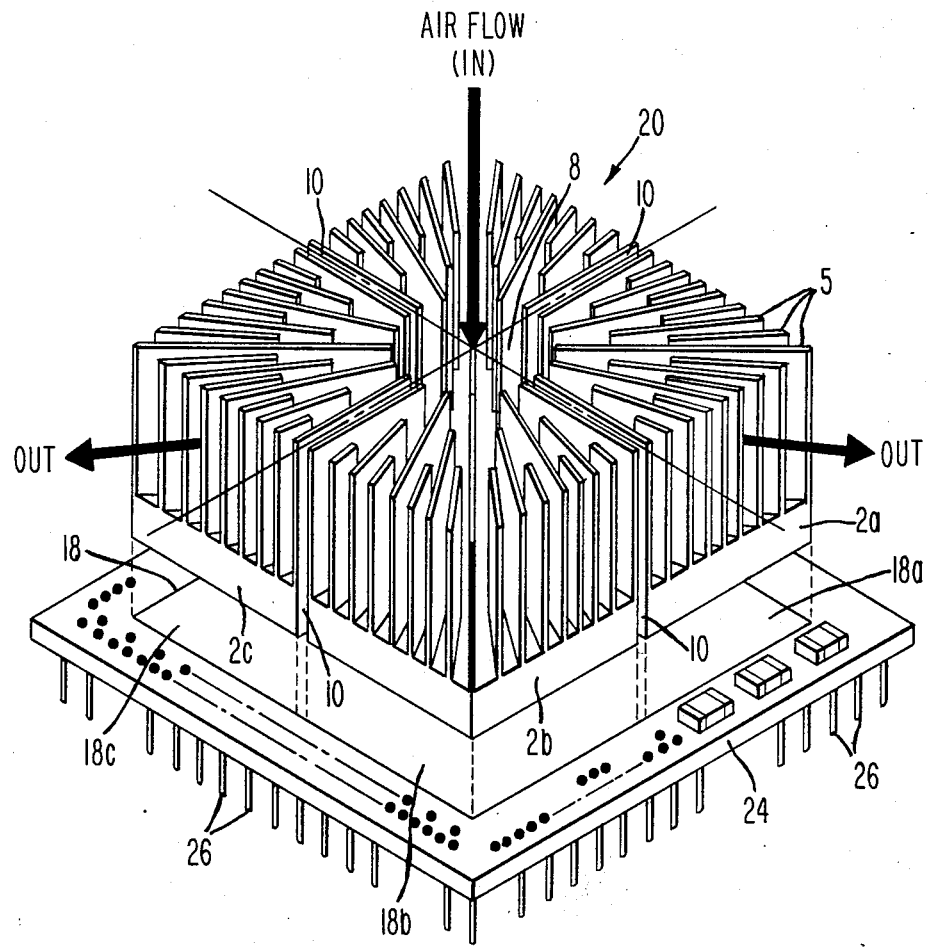
FIG. 1 is a perspective view of the segmented heat sink.

Referring to FIG. 1, there is seen an integrated circuit package 24 having underside pins 26.

An adhesive contact area 18 is provided on top of the integrated circuit package for the attachment of four separate heat sink segments.

Thus, as will be seen in FIG. 1, each separate heat sink sector has a lower base area, such that the first sector has a base area designated as $2_a$, the second sector has a base area designated as $2_b$, while the third sector has a base area designated as $2_c$ and the fourth sector area (shown in FIG. 2) is designated as $2_d$.

Figure 2:
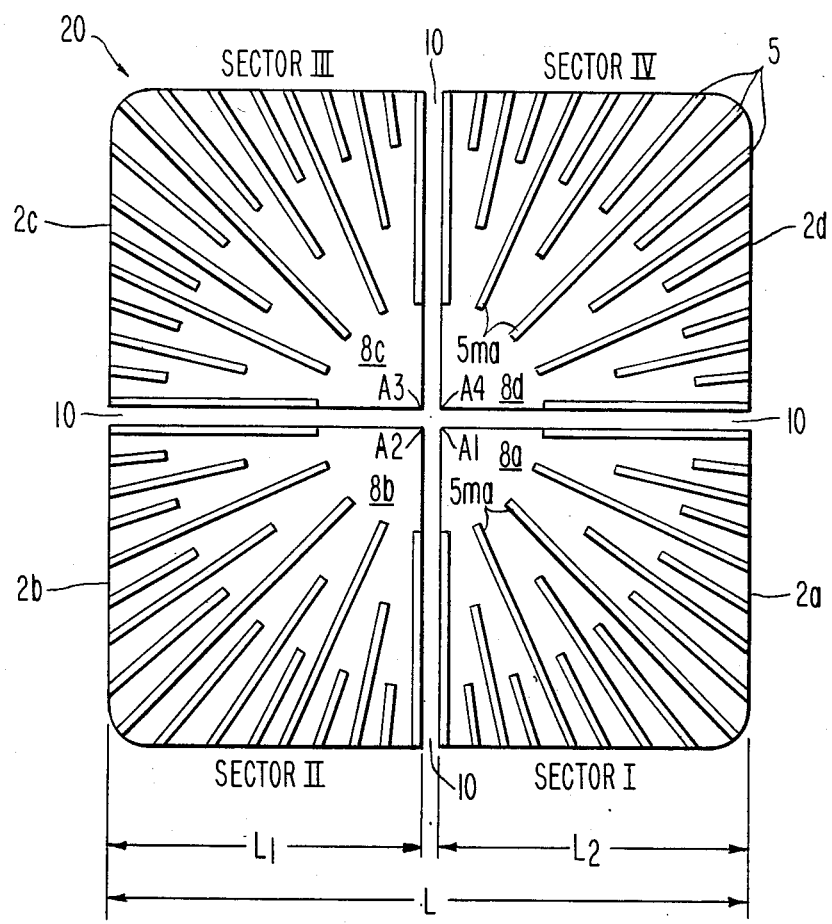
FIG. 2 is a top plan view of the four duplicative sectors.

Each of these heat sink sector areas are duplicates of each other making for ease of production. And, as seen in FIG. 1 and FIG. 2, each of the heat sink segments, when juxtaposed, then combine to form a set of radially oriented fins in a pattern of varying lengths. These fins are designated as items 5, and as will be seen in FIG. 2, the alternating variance in length of the fins 5 follow a specific pattern for providing a maximum of cooling area to the air flow.

It will be seen that the major length fins $5_{ma}$ are terminated before the end-areas ($8_a$, $8_b$, $8_c$, $8_d$) of the segments in a fashion so that a circular opening or orifice is configured when the four segments are placed in properly oriented proximity to each other. Thus, the areas $8_a$, $8_b$, $8_c$, and $8_d$ of each of the four segments cojoin to form the circular opening area 8 through which impinging airflow is pushed so that it may then be directed past the various fins of the various segments.

In FIG. 1 and in FIG. 2, it will be seen that there are spatial gaps 10 between each of the segments, thus minimizing the overall length of each segment and thus minimizing the amount of expansion/contraction stress which can occur in each segment during heating and cooling cycles. Because segment lengths are one-half what they would normally be were the heat sink a single piece, the stresses are approximately one-half.

In FIG. 1 there are four areas of the top of the integrated circuit package which correspond to the four base areas of the heat sink segments. The areas on the integrated circuit package for adhesive application are indicated as $18_a$, $18_b$, $18_c$, and (not shown) $18_d$, which is hidden by the perspective view.

Referring to FIG. 2, the segmented heat sink device 20 is shown in a top plan view. Here it may be seen that each segment is designated as sectors I, II, III, and IV. Each sector is seen to be a duplicate of each other, which makes for ease of manufacturing capablility and economy of parts.

Each sector has the same pattern of metallic fins with a design pattern of a long fin, a short fin, a medium length fin, a short fin, and a long fin ($5_{ma}$) whereupon the pattern repeats.

It will be seen that the major length fins, (long fins) $5_{ma}$ are cut or truncated in order to form the circular orifice pattern 8 in the central area of the four cooperating segments.

Due to the coutout sections 10 shown in FIG. 2, the expansion and contraction effects due to heating and cooling cycles are minimized since the peripheral distance along any one side of the quadrant is made substantailly shorter by the cutout 10.

Thus in FIG. 2 the overall side-length L, when undergoing heating and cooling cycles would have a rather large expansion and contraction deviation were it not for the cutout area 10 which separates each sector having lengths as $L_1$ and $L_2$.

Because of the linear cutout 10, the overall side length L is split into the two subsections designated $L_1$ and $L_2$. Each of these subsections $L_1$ and $L_2$, when undergoing heating and cooling cycles, will have a much smaller displacement than what would be the case if the overall length L was used.

The central area 8 (configured from $8_a$, $8_b$, $8_c$, $8_d$) of FIG. 2 is the inner circumference of the longest length fin elements which encompass a central air channel or aperture area 8 through which air can be impinged.

Sector I can be seen to show an illustration of how a long length fin element $5_{ma}$ is alternated with a short length fin element, a medium length fin element and another short length fin element in a repetitive pattern.

It will be seen in FIG. 2 that each sector has an inner origin point or apex ($A_1$, $A_2$, $A_3$, $A_4$) which is the approximate center on which are aligned the radial-oriented fins. Above each apex area, there may be provided a raised deflector to guide impinging air outward toward the periphery as an option, but this is not absolutely essential.

As previously mentioned, each segment is separated from its adjacent segment by a spatial gap 10 which is of a predetermined size and which is predetermined by a suitable auxiliary labor handling device as a holding fixture which can be used to hold the four segments together with the proper amount of spatial separation 10.

The labor saving holding fixture would permit the worker to carry and hold four of the segmented heat sink devices in one compact package with the proper spatial separation 10 so that it could be applied with adhesive to the contact area 18 of FIG. 1 in a simple fashion, whereby the applied adhesive would bond, with a heat conductive bond, the four sectors of the heat sink device to the proper areas of the integrated circuit package 24.

There has been described herein, a segmented heat sink device conprised of four duplicate sectors having radial cooling fins of patterned variable lengths. These duplicate sectors configure into an inexpensive cooling device which is adhesively attached to the top of an integrated circuit package. Each of these segments are separated by a defined air gap which shortens the linear distance, that is in adhesive contact with the integrated circuit package, and thus acts to minimize the expansion/contraction stress effect that occurs during the heating and cooling cycles. This minimizes the problem of breakage, degradation or disconnection of the adhesive bond between the heat sink device and the integrated circuit package. This is accomplished at the same time by providing an efficient air cooling and distribution system from a central orifice area through the patterned cooling fins which provide an unusually large surface area directing a steady flow of air across the finned elements.

While the above described segmented stress relieving heat sink device has been described in the preferred embodiment, there may be other variations of this device which fall within the concept as defined by the following claims.

What is claimed is:

1. A heat sink for enabling a stress-reduced bond between said heat sink and the contacting surface of an integrated circuit package comprising, in combination:
   (a) a plurality of baseplates, each baseplate having a square configuration and an inner apex from which there radiates a plurality of variable length fins which stand at right angles to each said baseplate; and
   (b) wherein each of said baseplates forms one sector of an overall configuration whereby four sectors are aligned adjacent one another without touching;
   (c) said inner apex of each of said baseplates in placed adjacent to one another without touching;
   (d) a plurality of fins rising at right angles to said baseplate and running in alignment with each said apex of each baseplate.

2. The heat sink of claim 1 wherein the inner area of each said baseplates adjacent to each apex is devoid of said fins.

3. The heat sink of claim 2 wherein each of said baseplates variable length fins alternate to form a pattern of longer-shorter-longer-shorter-longer length fins.

4. The heat sink of claim 2 wherein each of variable length fins follow a pattern length of long-short-intermediate-short-long.

5. The heat sink of claim 2 wherein said area adjacent to each apex forms an orifice for receipt of cooling air flow.

6. A heat sink having a four sector configuration of duplicate baseplate units comprising:
   (a) a plurality of square or rectangular baseplates placed in close juxtaposition without touching to form four sectors oriented about four inner apexes, wherein each sector includes:
      (a1) an inner apex which establishes an origin point from which a plurality of fins run radially to the periphery of each sector;
      (a2) an outer periphery to which each of said fins extend;
      (a3) an inner open area adjacent said apex which is devoid of said fins;
      (a4) a plurality of fins rising vertical to said baseplate and extending from beyond said inner open area to said periphery.

7. The heat sink of claim 6 wherein said plurality of fins form a pattern of alternate longer and shorter lengths.

8. The heat sink of claim 6 wherein said plurality of fins form a repetitive pattern of lengths involving long-short-intermediate-short.

9. The heat sink of claim 6 wherein said inner open area involves:
   (a) means for deflecting impinging air outward toward said periphery.

10. A heat sink having a four sector configuration of four duplicate square baseplate units each placed in close non-touching juxtaposition to form a central orifice area for diverting air flow across radially oriented fins outward past the periphery of each sector, the combination comprising:
    (a) said four duplicate square baseplate units holding vertical fin elements of variable length to form said four sectors and wherein the inner apex of each sector includes an area devoid of fins to form said central orifice area.

11. The heat sink of claim 10 wherein each of said four duplicate square baseplates includes:
    (a) holding and mounting means for maintaining said four baseplates in a desired configuration for adhesive attachment to an integrated circuit package.

* * * * *